(12) United States Patent
Gorbold et al.

(10) Patent No.: US 9,158,727 B2
(45) Date of Patent: Oct. 13, 2015

(54) ADDRESSABLE INTEGRATED CIRCUIT AND METHOD THEREOF

(75) Inventors: Jeremy Gorbold, Newbury (GB); James Gibbons, Castlebar (IE); Tadhg Creedon, Na Forbacha (IE); Katherine O'Riordan, Raheen (IE); John Reidy, Corbally (IE); John Morrissey, Lisnagry (IE)

(73) Assignee: ANALOG DEVICES, INC., Norwood, MA (US)

( * ) Notice: Subject to any disclaimer, the term of this patent is extended or adjusted under 35 U.S.C. 154(b) by 588 days.

(21) Appl. No.: 12/771,302

(22) Filed: Apr. 30, 2010

(65) Prior Publication Data

US 2010/0280786 A1 Nov. 4, 2010

Related U.S. Application Data (60) Provisional application No. 61/174,613, filed on May 1, 2009.

(51) Int. Cl.
| | |
|---|---|
| *G01R 19/175* | (2006.01) |
| *G01R 19/14* | (2006.01) |
| *G06F 3/00* | (2006.01) |
| *G06F 3/01* | (2006.01) |
| *G06F 13/42* | (2006.01) |
| *G06F 12/06* | (2006.01) |
| *G01R 31/36* | (2006.01) |

(52) U.S. Cl.
CPC ........ *G06F 13/4247* (2013.01); *G06F 12/0661* (2013.01); *G01R 31/3658* (2013.01)

(58) Field of Classification Search
CPC .................................................. G01R 31/3658
USPC ............ 702/19, 61, 104, 120, 150, 158, 187, 702/188; 235/383; 340/5.1; 714/746
See application file for complete search history.

(56) References Cited

U.S. PATENT DOCUMENTS

| | | | |
|---|---|---|---|
| 3,798,608 | A | 3/1974 | Huebner |
| 5,099,205 | A | 3/1992 | Lewyn |
| 5,317,693 | A | 5/1994 | Cuenod et al. |

(Continued)

FOREIGN PATENT DOCUMENTS

WO 9621181 A1 7/1996

OTHER PUBLICATIONS

International Search Report dated Jul. 16, 2010, in counterpart international application No. PCT/US2010/033187.

(Continued)

*Primary Examiner* — Eliseo Ramos Feliciano
*Assistant Examiner* — Felix Suarez
(74) *Attorney, Agent, or Firm* — Kenyon & Kenyon LLP (57) ABSTRACT

An exemplary method and system of addressing an integrated circuit within a daisy chain network. In the exemplary method, the address of the integrated circuit may be initialized to a predetermined initial address. The integrated circuit may receive a command that includes a type identifier and an address field. Based on the type identifier, the type of command may be determined. As a result of the determination, reading the address from the address field. The read address may be stored in a register. The address may be modified, and may be output. Upon receipt of the data or a command, the integrity of the data including data within the received command, may be confirmed by an error checking algorithm.

30 Claims, 6 Drawing Sheets

(56) References Cited

U.S. PATENT DOCUMENTS

| | | | |
|---|---|---|---|
| 5,359,296 | A | 10/1994 | Brooks et al. |
| 5,677,077 | A | 10/1997 | Faulk |
| 5,841,996 | A | 11/1998 | Nolan et al. |
| 6,089,453 | A * | 7/2000 | Kayser et al. ............... 235/383 |
| 6,268,710 | B1 | 7/2001 | Koga |
| 6,313,637 | B1 | 11/2001 | Iino et al. |
| 6,362,626 | B2 | 3/2002 | Furukawa |
| 6,367,570 | B1 | 4/2002 | Long, III et al. |
| 6,639,408 | B2 | 10/2003 | Yudahira et al. |
| 6,762,588 | B2 | 7/2004 | Miyazaki et al. |
| 6,891,352 | B2 | 5/2005 | Miyazaki et al. |
| 6,970,966 | B2 * | 11/2005 | Gemelli et al. ............... 710/305 |
| 7,826,294 | B2 * | 11/2010 | Oh et al. .................... 365/221 |
| 7,848,905 | B2 * | 12/2010 | Troxler et al. ............... 702/187 |
| 7,859,223 | B2 * | 12/2010 | Gorbold ..................... 320/119 |
| 8,074,136 | B2 * | 12/2011 | Yu et al. ..................... 714/746 |
| 8,082,115 | B2 * | 12/2011 | Bechhoefer et al. .......... 702/34 |
| 8,130,000 | B2 * | 3/2012 | Botker et al. ............... 324/433 |
| 2002/0188781 | A1 | 12/2002 | Schoch et al. |
| 2003/0044689 | A1 | 3/2003 | Miyazaki et al. |
| 2004/0051534 | A1 | 3/2004 | Kobayashi et al. |
| 2004/0160229 | A1 | 8/2004 | Fujita et al. |
| 2004/0230885 | A1 | 11/2004 | Newcombe et al. |
| 2005/0253559 | A1 | 11/2005 | Felder |
| 2006/0287783 | A1 * | 12/2006 | Walker ........................ 701/29 |
| 2007/0182375 | A1 | 8/2007 | Lee |
| 2007/0234071 | A1 | 10/2007 | Pyeon |
| 2008/0148121 | A1 | 6/2008 | Yu et al. |
| 2008/0180106 | A1 | 7/2008 | Gorbold |
| 2008/0183914 | A1 | 7/2008 | Gorbold et al. |
| 2008/0238432 | A1 | 10/2008 | Botker et al. |
| 2010/0102926 | A1 * | 4/2010 | Grieve et al. ............... 340/5.1 |

OTHER PUBLICATIONS

European Search Report and Search Opinion in counterpart European Application No. 10770427.2, communication dated Nov. 22, 2012.

Analog Devices, Inc., "High Voltage Current Shunt Monitor", AD8212 datasheet, Rev. B, May 2009, pp. 1-16.

Kudo, Akihiko et al., "Cell Controller for Lithium Ion Battery using ASIC", Shin-Kobe Technical Report No. 16, Shin-Kobe Electric Machinery Co., Ltd., 2006, pp. 16-20.

PCT/US2008/001312, International Search Report and Written Opinion, Jun. 13, 2008.

PCT/US2008/002690, International Search Report and Written Opinion, Jun. 10, 2008.

* cited by examiner

ADDRESSABLE INTEGRATED CIRCUIT AND METHOD THEREOF

This application claims priority to U.S. Provisional Patent Application Ser. No. 61/174,613 filed on May 1, 2009, the entire contents of which are incorporated herein by reference.

BACKGROUND

The present invention relates to circuit systems in which a plurality of integrated circuits are interconnected via "daisy chain" communication links, such as single conductor, point-to-point serial communication links.

Daisy chains may be found in circuit systems in which a plurality of integrated circuits are provided in a stacked configuration. For example, a stack of voltage monitors may be provided in an electrical system to measure voltage of a corresponding stack of battery cells of a battery system. Each integrated circuit is to measure a voltage of a corresponding portion of the battery system and report its measurement to a common location, typically a processor or microcontroller. Rather than connect each integrated circuit directly to the processor via a common bus and incur the complexities involved in addressing each integrated circuit separately, it may be advantageous to provide a daisy chain of communication links in which only one integrated circuit is connected to the processor. The remaining integrated circuits each would be connected to its neighbor via a point-to-point communication link. Communication between the integrated circuits and the processor may be conducted in a "bucket brigade" fashion in which a message is conveyed between the processor and a destination integrated circuit via intermediate integrated circuits in the daisy chain.

However, due to errors in the communication paths either the integrated circuit can receive erroneous commands or provide erroneous data to the connected microprocessor. Therefore, it would be beneficial to provide a system for checking the address of each of the integrated circuits to maintain data integrity.

An exemplary implementation of an integrated circuit in a daisy chain network configuration is described in U.S. Patent Application Publication No. 2008/0180106 (U.S. patent application Ser. No. 12/011,615, now U.S. Pat. No. 7,859,223, issued Dec. 28, 2010) to Jeremy Gorbold, entitled "BATTERY MONITORING APPARATUS AND DAISY CHAIN INTERFACE SUITABLE FOR USE IN A BATTERY MONITORING APPARATUS."

DETAILED DESCRIPTION

Embodiments of the present invention include a method of assigning an address to an integrated circuit within a daisy chain network. In the exemplary method, the address of the integrated circuit may be initialized to a predetermined initial address. The integrated circuit may receive a command that includes a type identifier and an address field. Based on the type identifier of the received command, the type of command may be determined. If the command is determined to be a first type of command, a specific address provided by a processor may be assigned to the integrated circuit and written into an address module of the integrated circuit. If it is determined the command is of a second type meaning that it was sent from an adjacent integrated circuit, an address from the address field of the command may be assigned to the integrated circuit and may be written into the address module. Control signals may be output by the controller based on the determined type of command, and may include the assigned address of the integrated circuit.

Embodiments of the present invention include a battery stack monitoring system that may include a measurement circuit, an integrated circuit and a processor. The measurement circuit may be configured to measure parameters of a battery stack, and output signals representative of the measured battery stack parameters. The integrated circuit may be communicatively coupled to the measurement circuit, and have a unique address within a network. The integrated circuit may be configured to receive commands and input data and also determine the types of commands received; and output data including addressing data. The processor may be configured to poll the integrated circuit using the unique address of the integrated circuit for data representative of the measured battery stack parameters. The data received from the integrated circuit may be error checked using an error checking routine and the unique address of the integrated circuit.

Figure 1:
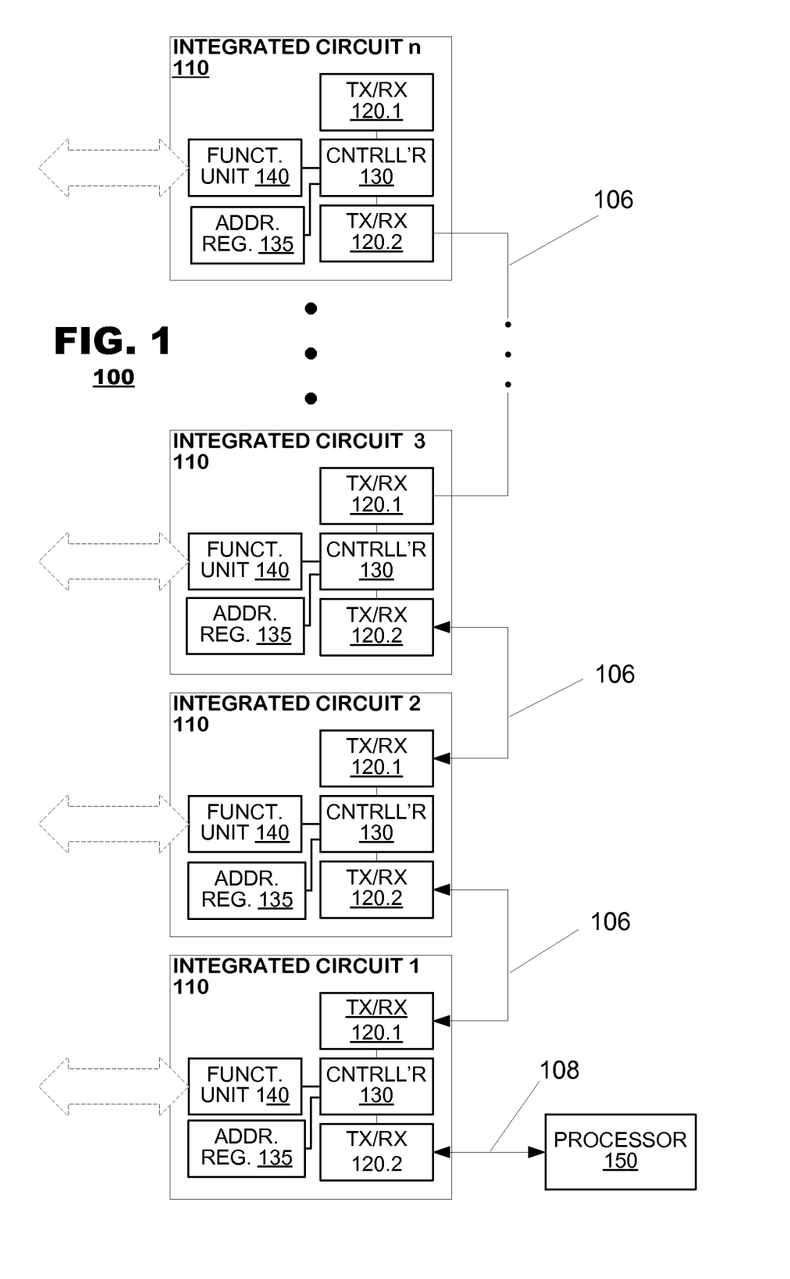
FIG. 1 illustrates a daisy chain network according to an embodiment of the present invention.

FIG. 1 depicts an embodiment of an integrated circuit that enables a more efficient communication between a plurality of integrated circuits connected in a daisy chain under control of a processor. In FIG. 1, the integrated circuit 110 includes a first transceiver 120.1 and a second transceiver 120.2, a controller 130, an address register 135 and a functional unit 140. The transceivers 120.1 and 120.2 may be configured to communicate between the integrated circuit 110 (for example, integrated circuit 1) and other integrated circuits (for example, any one of or any combination of integrated circuits 2, 3 to n). Each transceiver 120.1 or 120.2 may be configured to communicate between the integrated circuit 110 and a processor 150.

The controller 130 may be configured to control operation of the integrated circuit 110 in a system having a plurality of integrated circuits interconnected to form a daisy chain network 100. The exemplary configuration shown in FIG. 1 depicts an embodiment of a plurality of instances of the integrated circuits 110 configured in a daisy chain network of integrated circuits 1-$n$.

The functional units 140 may be any type of sensing unit, for example, a voltage sensing circuit, or an operating mechanism, for example, a switch actuating circuit, which is suitable for functioning when connected in a daisy chain network. In the exemplary embodiment of FIG. 1, the daisy chain 100 of integrated circuits 1-$n$ may be communicatively connected to one another via communication paths 106. The communication paths 106 may be a wired channel, a wireless channel, fiber optic, other optical communication media or any other communication path suitable for transmitting data. As explained above, a transceiver 120.2 may be configured to interface with an external processor, such as processor 150. The processor may be external to the integrated circuits 1-*n*, and may be available, for example, on an automobile. In the example shown, the transceiver 120.2 of integrated circuit 1 is shown interfacing with the processor 150 via communication path 108. Of course, any of the other transceivers 120.1 or 120.2 in any of the other integrated circuits 1-*n* may be the transceiver that interfaces with the processor 150.

The analysis of the commands by each of the respective controllers 130 includes reviewing an address field of the command to determine whether the command is addressed to the respective integrated circuit. An addressing process according to an embodiment of the present invention will be described with reference to FIG. 2.

Figure 2:
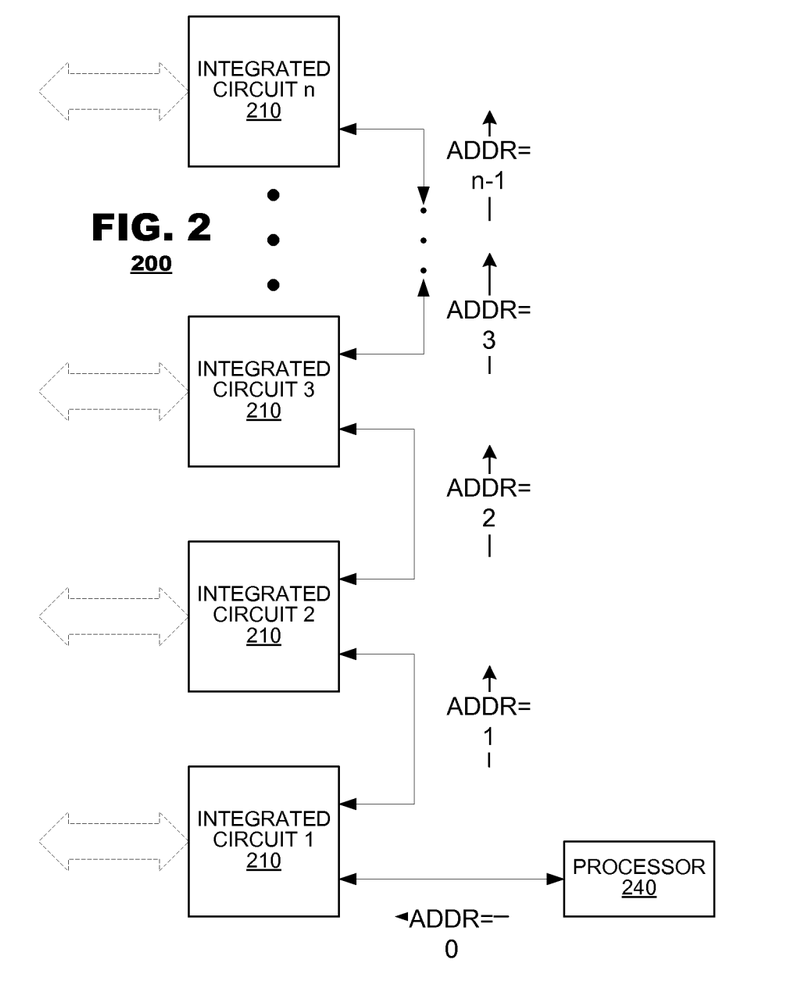
FIG. 2 illustrates an exemplary daisy chain addressing scheme according to another embodiment of the present invention.

FIG. 2 depicts an embodiment of an addressing scheme used by the exemplary embodiments. FIG. 2 illustrates a daisy chain network 200 including a plurality of integrated circuits 210 1-*n* connected in a daisy chain network configuration and a processor 240. The processor 240 is connected to a first integrated circuit 210 1. The processor 240 may issue an initialize command that may assign a first address (e.g., ADDR=0) to the integrated circuit 210 1. The assigned address may be stored in the address register (not shown) of the integrated circuit 210 1. The address may be incremented (e.g., ADDR=1) to a next address value. A command generated at the integrated circuit 210 1. The generated command may include the incremented address in an address field and a command type indicating an initialize command. The command may be forwarded to the next integrated circuit 210 2 in the daisy chain network 200.

The next integrated circuit 210 2 analyzes the received command to determine if the command type is an "initialize" command. If so, the integrated circuit 210 2 stores the address (i.e., ADDR=1) in its address register (not shown). The integrated circuit 210 2 may increment the address (e.g., ADDR=2) and generate a command including the incremented address in an address field and the command type in a command type field. The command may be forwarded to the next integrated circuit 210 3 in the daisy chain network 200. As was done in integrated circuit 210 2, the integrated circuit 210 3 may analyze the command to determine if the command type is an "initialize" command. If it is determined that the command is an initialize command, the process performed in integrated circuit 210 2 repeats with the address being stored, incremented, and a new command generated and forwarded. This occurs until the last integrated circuit in the daisy chain network 200, integrated circuit 210 *n*, is assigned an address (e.g., ADDR=n).

Figure 3:
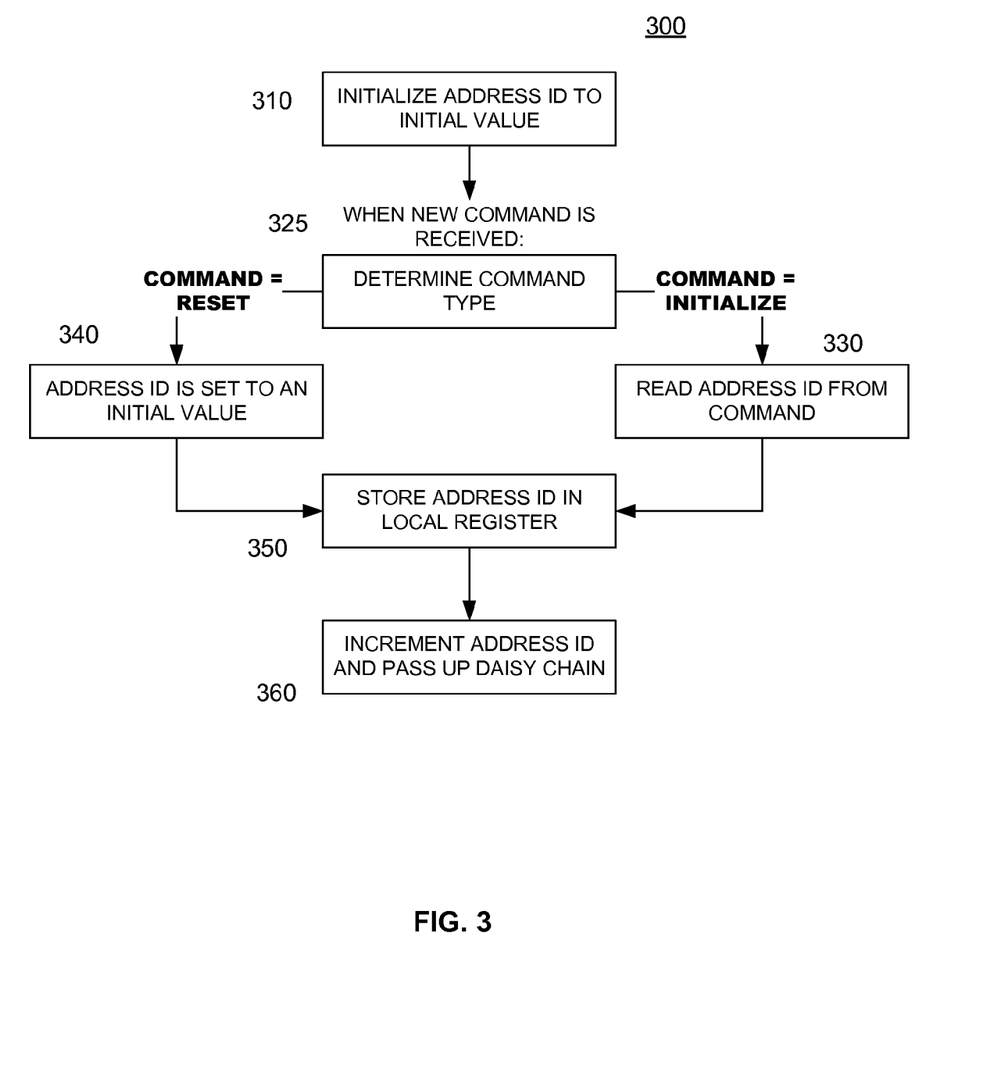
FIG. 3 illustrates an exemplary method for addressing an integrated circuit according to an embodiment of the present invention.

FIG. 3 illustrates an exemplary method 300 for addressing an integrated circuit according to an embodiment of the present invention. In step 310 of FIG. 3, at start up, for example, an address of each integrated circuit, for example, integrated circuit 110 in a daisy chain network shown in FIG. 1, may be reset to an initial value, such as, for example, 000, or any other address value. The reset may occur at start up or in response to a processor command. For example, in certain situations, if an addressing error is found, the processor may issue a command to trigger a reset of the unique addresses of the integrated circuits to an initial value.

The command may be sent along a command line, such as a communication path 108 in FIG. 1, from a processor interfacing with an integrated circuit of the daisy chain. Each command may include a plurality of data fields, such as, for example, a command type field having bits that indicate the type of the command, an address field having bits indicating an address, data fields and the like. The different command type bits indicate whether the command is received from a processor (e.g., 150 of FIG. 1) or from another daisy chain circuit (e.g., one of integrated circuits 110 1-*n* of FIG. 1). Alternatively, commands may be forwarded in a "bucket brigade" manner from the first integrated circuit to a next.

In the exemplary embodiment, when a command is received at an integrated circuit (either from a processor or another integrated circuit), the type of command is determined (step 325). The determination of the type of command may be made by a controller in the integrated circuit (as described previously with respect to FIG. 1) connected to the processor. For example, the controller may analyze the bits in the command type data field, which indicates the type of command. If the command is from the processor 150, the command will have bits set in the command type field indicating that the processor sent it. In the example, the command may be determined at step 325 to be a trigger, i.e. "command=Reset" in FIG. 3, in which case the process advances to step 340. The "Reset" command from the processor may cause, at step 340, an address reset sequence, where the controller of the receiving integrated chip resets the address in the integrated chip's address module (e.g., 432 of the registers 430 of the integrated circuit 110 of FIGS. 1 and 4, respectively) to an initial value. The initial value, for example, may be 0 h or some other value. The "Reset" command may be given when an addressing error is detected by one of the integrated circuits. An addressing error may be indicated when an address of one of the integrated circuits may be corrupted.

After setting the address of the integrated circuit back to an initial value, the process advances to step 350, in which the reset address value is written to the address register. At step 360, the integrated circuit may increment the reset address value, and forward the command to a next integrated circuit, either upstream or down stream.

Alternatively, at step 325, if the command type is determined to be an "initialization" command, or, in other words, a command received from another integrated circuit, the command may be determined to be an initialize command, i.e., "command=initialize", and the process may proceed to step 330. The command may contain bits in its command type data field that indicate that the command has been forwarded from another integrated circuit, and may contain an address in the command address field that has been incremented by the previous integrated circuit in the daisy chain network.

Figure 4:
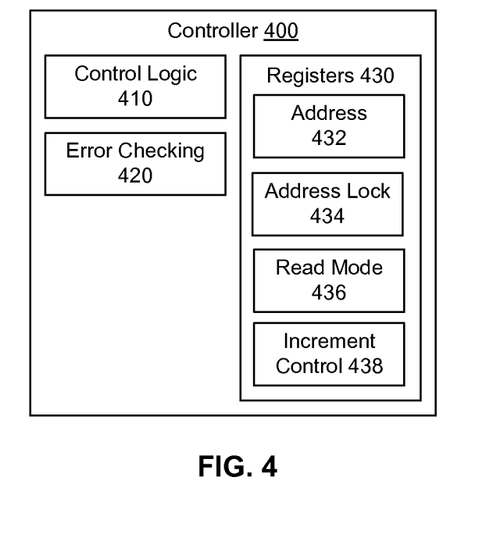
FIG. 4 illustrates exemplary components of a controller of an integrated circuit according to an embodiment of the present invention.

At step 330, the address in the address field of the command is read, and the process advances to step 350. At step 350, the read address may be written to an address module, such as address module 432 in registers 430 of controller 400 as shown in FIG. 4. After confirming the address via an error checking algorithm, the address is written to the address register or module. The integrated circuit, at step 360, may increment the address, generate a command, insert the incremented address in the address field of the command, set the command type bits to indicate the command type, and forward the command to the next integrated circuit in the daisy chain.

The details of an integrated circuit controller will be described with referent to FIG. 4. FIG. 4 illustrates exemplary components of a controller of an integrated circuit according to an embodiment of the present invention. In FIG. 4, the controller 400 may include control logic 410, an error checking module 420, and data registers 430. The control logic 410 may be configured to control the intercommunication of data and signals among the components of an integrated circuit, such as the transceiver, and, in the embodiment of FIG. 2, the measurement circuit 200. The data registers 430 may include an address module 432, an address lock module 434, a read mode module 436, and an increment control module 436. The address module 432 of the data registers may be configured to store an address or other information that uniquely identifies a particular instance of an integrated circuit, e.g., 110. The read mode module 436 may be configured to store data that controls a read mode in which an integrated circuit operates. For example, the data stored in the read mode module 436 can control whether measurement data stored in the integrated circuits (for example, see FIGS. 1, 5 and 6) can be read out from a single individually addressed instance of an integrated circuit, or from all integrated circuits in the daisy chain in an automated combined read operation. The increment control module 438 may be configured to store data that controls whether or not the integrated circuit increments an address received at the integrated circuit before passing it along to another instance of the integrated circuit. The increment control module 438 may be activated depending upon the type of commands received at the integrated circuit. The error checking module 420 may be configured to monitor data transmitted from the integrated circuit according to an error checking algorithm, such as, for example, a cyclic redundancy check (CRC) algorithm. The error checking algorithm may use, for example, the address stored in the address data fields of received commands, when executed. The address in the command may be compared to the unique address of the integrated circuit stored in the address module 432. This allows for confirmation of the integrity of the data and enables identification of transmitted data as originating from or destined to a particular integrated circuit. Of course, methods of error checking other CRC may be used.

Figure 5:
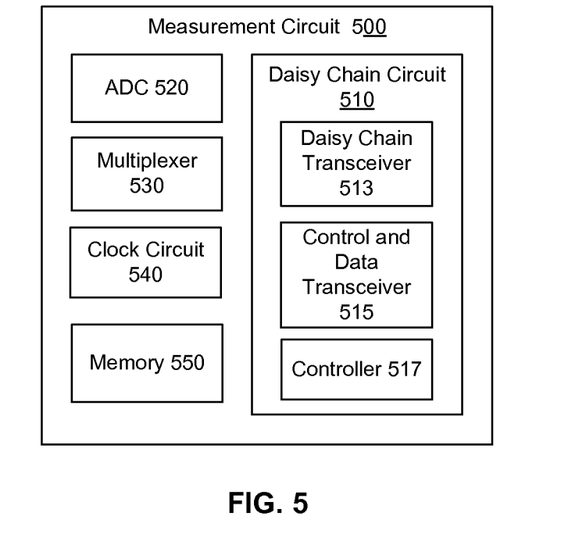
FIG. 5 illustrates an exemplary functional unit incorporating an integrated circuit configured according to another embodiment of the present invention.

FIG. 5 depicts an embodiment of a functional unit incorporating an integrated circuit according to an embodiment of the present invention. In FIG. 5, the functional unit, a measurement circuit 500, may include an embodiment of the integrated circuit 510. The measurement circuit 500 may include an analog-to-digital converter (ADC) 520, a multiplexer 530, a clock circuit 540, and a memory 550. The integrated circuit 510 may be configured to communicate with other instances of the measurement circuit 500. The multiplexer 530 may be configured to receive a plurality of measurement signals arriving at the measurement circuit 500 from external circuits or devices (not shown). The ADC 520 may be configured to convert the plurality of measurement signals from an analog representation into a digital representation. The clock circuit 540 may be configured to supply clock signals to other portions of the measurement circuit 500. The memory 550 may be configured to store the digital representations converted by the ADC 520 of the measurement signals.

Figure 6:
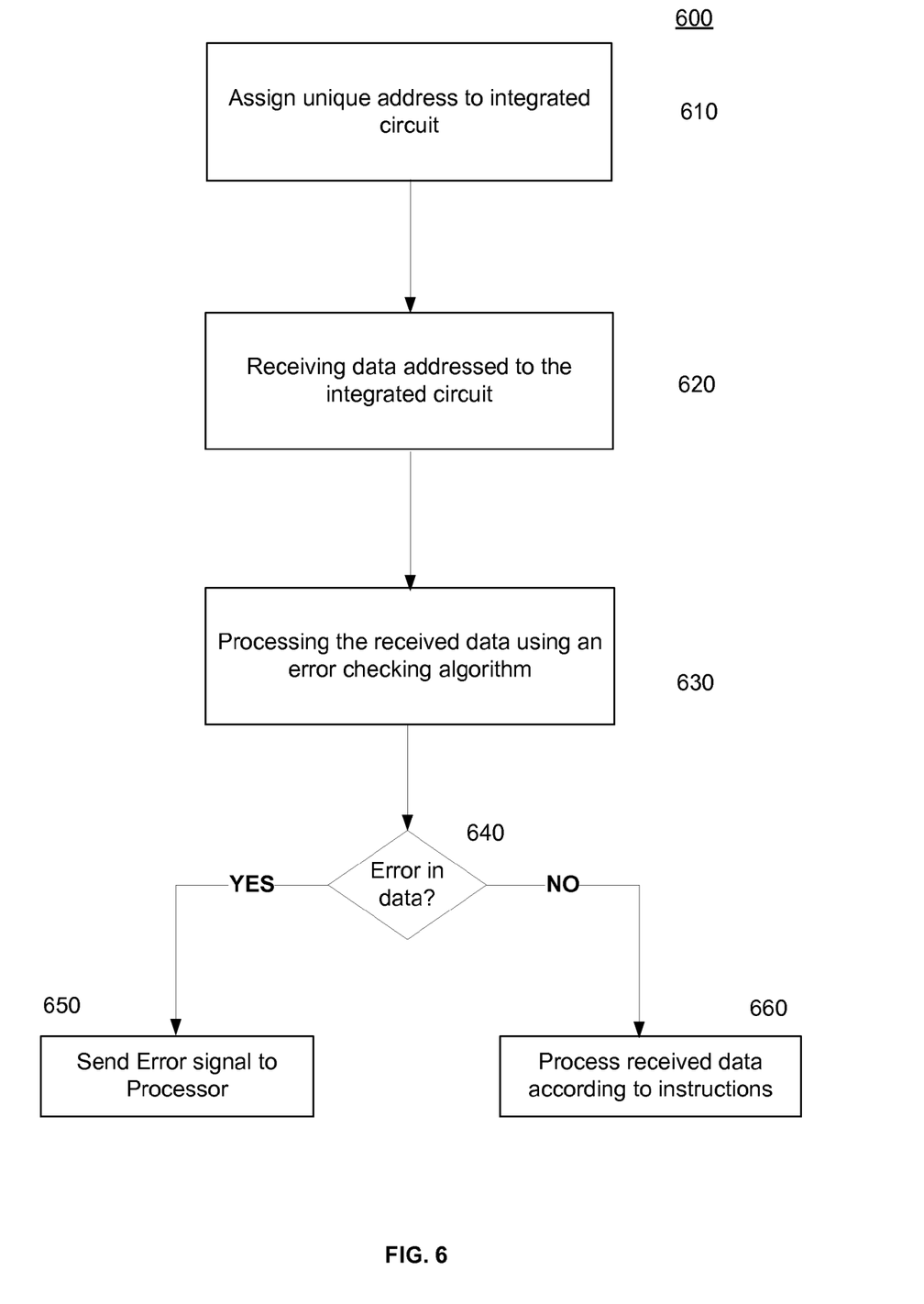
FIG. 6 illustrates an exemplary method of managing communication between integrated circuits in a daisy chain network according to an embodiment of the present invention.

FIG. 6 describes a process for managing the distribution of data within a daisy chain network using an error checking algorithm. The process 600 for managing the distribution of data begins, at step 610, by assigning a unique address to an integrated circuit in a daisy chain network. As previously described with respect to FIGS. 2 and 3, each of the integrated circuits in the daisy chain network can be assigned a unique address that allows each of the integrated circuits to be individually addressable, but also allows error checking of data provided to the individual daisy chains to be performed by using the unique address. Once assigned the unique address, the unique address is stored in a register of the integrated circuit (Step 620). A processor connected to the daisy chain network may send commands to the respective integrated circuits and receive back data related to the content of the command. A command may include a number of data fields such as a command type field, an address field, a data (e.g., temperature, voltage, current, etc.) field, and other fields. The address field may have a unique address of the integrated circuit for which the data is intended. When a command is received at the integrated circuit, an error checking module of the integrated circuit may process the received data according to an error checking algorithm. The error checking algorithm may use the unique address in the address field of the command to confirm the address data is not corrupted (Step 630). The error checking algorithm may produce a result that indicates an error in the received data. In an embodiment having a 32-bit message, for example, that is sent from a microprocessor to a functional circuit, the 32-bit message may include 21 bits of message data, 8 bits of CRC data, and 3 trailing zero bits. An 8-bit cyclic redundancy checking (CRC) error checking algorithm using the 8 bits of CRC data may be applied to the 21 bits of message data to determine if any errors occur. The 21 bits may comprise a device address, a register address, register data, an address all parts bit, and a reserved bit. In another embodiment in which data is being transferred to the microprocessor from a functional circuit, a 32-bit message, for example, may have different bit formats depending on whether the message includes monitored data (data provided by a functional unit) or set up data (e.g., data to allow the microprocessor to check the configuration of parts in the daisy chain). If the 32-bit message, for example, comprises monitored data, the message may include a device address, a channel address, monitored data, a write acknowledge bit. The 32-bit message may comprise 22 bits with 8 bits of CRC and 2 trailing zero bits. Alternatively, if, for example, the 32-bit message comprises set up data, the message may include a device address, channel address, set up data and a write acknowledgement. The set up data message may include 22 bits covered by an 8-bit CRC and 2 trailing zero bits. In each example, the trailing zero bits are not covered by the CRC error checking algorithm. Any errors that may be detected may be a result of erroneous data in any of the fields, such as an address field.

At step 640, it is determined whether there is an error in the data. If the result of the error checking indicates a data error, an error signal may be sent, at step 650, by an integrated circuit controller to a processor connected to the integrated circuits. Alternatively, if the result of the error checking indicates no data error, the received command, at step 660, may be processed according to instructions from a controller in the integrated circuit.

Figure 7:
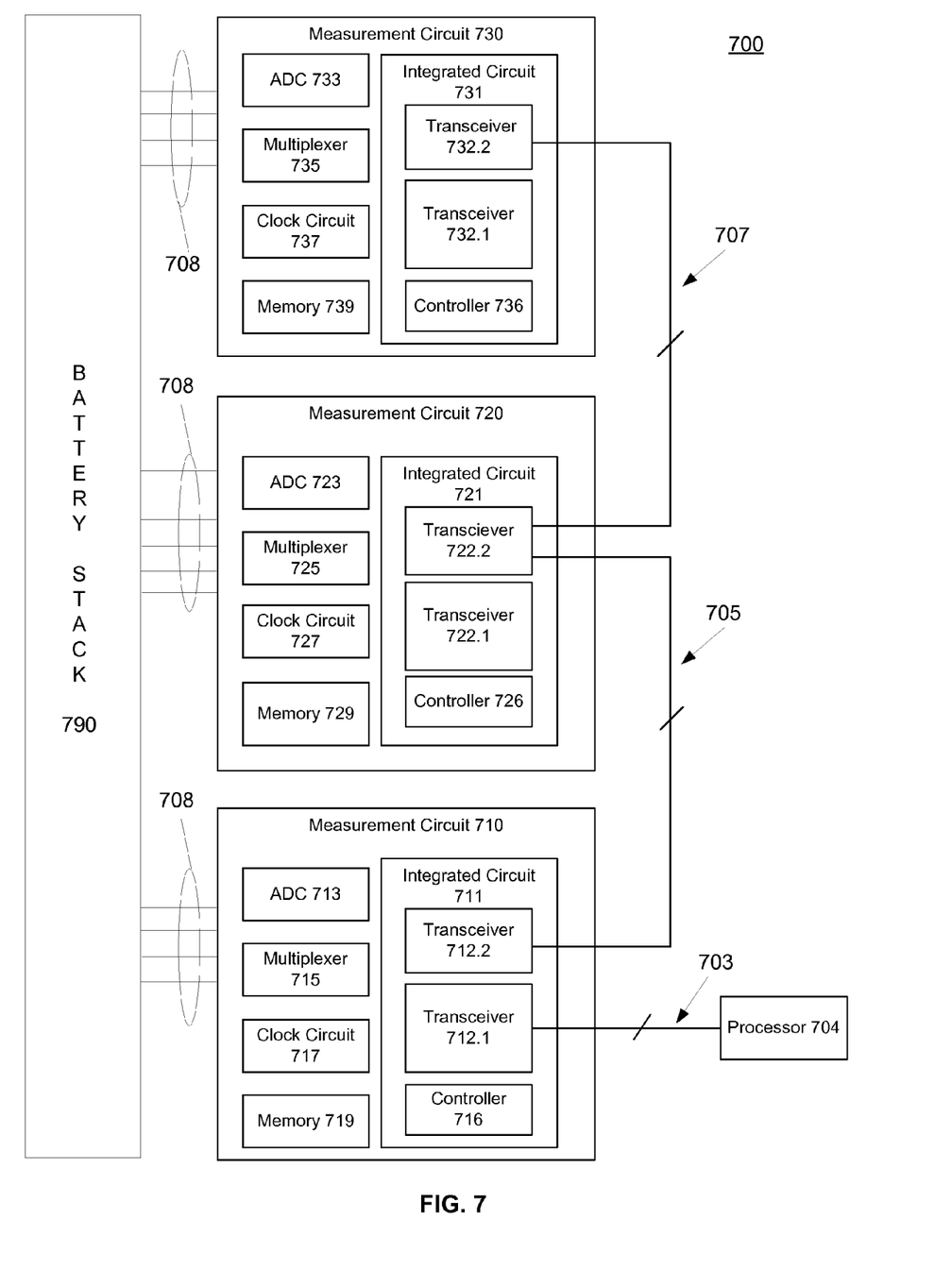
FIG. 7 illustrates an exemplary implementation of the integrated circuit in a battery monitoring daisy chain network according to an embodiment of the present invention.

FIG. 7 illustrates an exemplary implementation of an integrated circuit according to an embodiment of the present invention. The exemplary implementation of the integrated circuit may be in a battery stack monitoring system.

The battery stack monitoring system 700 may include a processor 704, measurement circuits 710, 720 and 730, and a battery stack 790. The battery monitoring system 700 may be used to monitor the battery stack of a hybrid electric vehicle, an electric vehicle, or similar application that utilizes battery power. The processor 704, which coordinates and controls the monitoring of the battery, may be a processor external to a vehicle, or may be a processor available on the vehicle. The battery stack 790 may include a plurality of cells formed from, for example, stacked lithium ion batteries. The battery stack 790 may be similar to those known to one of ordinary skill in the art.

Each of the measurement circuits 710, 720 and 730 may comprise similar components. For the sake of brevity, the components of only measurement circuit 710, which is similar to that shown in FIG. 2, will be described. The measurement circuit 710 (720, 730) may include an integrated circuit 711 (721, 731), an analog-to-digital converter (ADC) 713 (723, 733), a multiplexer 715 (725, 735), clock circuit 717 (727, 737), and a memory 719 (729, 739). The measurement circuit 710 (720, 730) may have connections 708 to the battery stack 790 to sample battery stack parameters, such as, for example, temperature and voltage, of a predetermined number of, such as, for example, six, cells of the plurality of cells that form the battery stack 790. The measurement circuit 710 may be configured to measure parameters of the battery stack 790, and output signals representative of the measured battery stack 790 parameters.

The integrated circuit 711 may be communicatively coupled to the measurement circuit. The integrated circuit 711 may include a first transceiver 712.1, a second transceiver 712.2 and a controller 716. The controller 716 may be configured as shown in FIG. 4. Each of the integrated circuits 711 may have a unique address assigned to it within the daisy chain network. The integrated circuit may be configured to receive commands and data messages, the commands and data messages including an address field. As explained above with reference to FIG. 3, each integrated circuit may determine the types of commands received and perform different functions based on the type of command. The integrated circuit controller 716 may include components configured to error check the received data, and may execute and/or generate commands using an error checking routine and the unique address of the circuit. Based on command instructions from the controller 716, data related to the battery stack parameters and addressing data may be output by the integrated circuit 711 via transceiver 712.1 or 712.2 over communication path 705.

The processor 704 may be connected to a measurement circuit, such as, for example, 710, having an integrated circuit 711. The processor 704 may be configured to poll each of the measurement circuits 710, 720 and 730, for data representative of the measured battery stack parameters. Each of the measurement circuits 710, 720 and 730 can be individually polled using the unique address of the respective integrated circuit.

For example, the processor 704 may need the measurement data obtained by measurement circuit 730. The processor 704 may output a command requesting the measured data from the measurement circuit 730. The command may include a number of data fields including, for example, a command field, a data field, an address field and other fields. If the command is for measurement circuit 730, the address of the integrated circuit 731 may be in the address field of the command. The command including the address of the integrated circuit for which the command is intended, is output from the processor 704 via connection 703. The connection 703 may be a wired connection or other suitable communication medium. The integrated circuit 711 may receive the processor output command at a control and data transceiver 712.1. The data fields of the received command may be analyzed by the controller 716. During the analysis, an error checking algorithm, such as cyclic redundancy checking (CRC), may be performed. As a result of the analysis, if the controller 716 determines that the address field of the received command contains the correct unique address of the integrated circuit 711, the controller 716 may respond to or take other action based on the substance of the command. The controller 716 may confirm that the command is not addressed to it by comparing the assigned address of integrated circuit 710 to the address in the command. Since in this example, the command is addressed to measurement circuit 730, the command is passed onto the next integrated circuit 720 by transceiver 712.2. The details of transceiver 712.2 may be similar to those of transceivers 213.1 and 213.2 as explained with reference to FIG. 2. In this example, transceiver 712.2 may be connected via communication path 705 to integrated circuit 721 of measurement circuit 720. The transceiver 722.2 of integrated circuit 721 may receive data input to the integrated circuit 721 via communication path 705. At transceiver 722.2, the command may be analyzed by the controller 726. The controller 726 may determine that the address field of the received command does not contain the unique address of the integrated circuit 721, and the command is passed onto the next integrated circuit 730 by transceiver 722.2 via communication path 708 connected to measurement circuit 730.

In the example, at measurement circuit 730, the command may be received via the communication path 707 at the transceiver 732.1 of integrated circuit 731. The data fields of the received command may be analyzed by the controller 736, and it may be determined that the address field of the received command contains the unique address of the integrated circuit 731. In this example, the address field of the received command does contain the unique address of the integrated circuit 730; the controller 736 confirms the address by error checking and compares the received address with its assigned address stored in memory 736. Based on the results of the confirmation and comparison, the controller 736 performs the action requested by the processor 704 based on the analyzed data fields in the received command.

The error checking may be accomplished at the individual measurement circuits 710, 720 and 730. As described with reference to FIG. 4, controllers in the individual integrated circuits may include an error checking module for error checking. Although the processor 704 is shown in the illustrated example connected to the transceiver 712.1 and transceivers 712.2, 722.2 and 732.2 are shown connected to one another, it should be understood that other configurations are possible, and that the claimed embodiments should not be limited to the illustrated example.

It should be understood that there exist implementations of other variations and modifications of the invention and its various aspects, as may be readily apparent to those of ordinary skill in the art, and that the invention is not limited by specific embodiments described herein. Features and embodiments described above may be combined with and without each other. It is therefore contemplated to cover any and all modifications, variations, combinations or equivalents that fall within the scope of the basic underlying principals disclosed and claimed herein.

What is claimed is:

1. An integrated circuit, comprising:
   a monitoring circuit to measure at least one voltage present on an input of the integrated circuit;
   a first transceiver for point-to-point connection to a first adjacent integrated circuit in a daisy chain network, the first transceiver to receive an input signal from the network representing a command identified in a command type field, the input signal directed to one of a plurality of integrated circuits in the daisy chain network identified by an address value provided in an address field of the command, and for transmitting an output signal to the network;
   a second transceiver for point-to-point connection to a second adjacent integrated circuit in the daisy chain network; and a controller communicatively coupled to the first transceiver and configured to determine a type of the command;

wherein, when the provided address value matches an address of the integrated circuit, the controller:

executes the command; and causes the first transceiver to issue corresponding output signal content, wherein when the command comprises an instruction to report measurements, the controller causes the first transceiver to output data representing a measurement of the monitoring circuit; and wherein, when the provided address value does not match the address of the integrated circuit, the controller causes the second transceiver to transmit the command to a next segment of the daisy chain network.

2. The integrated circuit of claim 1, wherein the input signal is received from one of a processor and another integrated circuit.

3. The integrated circuit of claim 1, wherein the command is to reset the addresses of all the integrated circuits in the network.

4. The integrated circuit of claim 3, wherein the resetting occurs during initialization.

5. The integrated circuit of claim 3, wherein the resetting further comprises:

assigning a particular current address to the integrated circuit;

modifying the current address to a next address in a sequence;

forwarding the received address reset command, including the next address as a designated address, to the next integrated circuit.

6. The integrated circuit of claim 5, wherein the current address is one of a predetermined address and a specified address.

7. The integrated circuit of claim 1, wherein the controller is further configured to:

execute an error checking algorithm on the input signal to confirm that the command in the input signal is correctly addressed to the integrated circuit by using the provided address in the address field of the command to confirm the provided address is not corrupted; and send a response to a processor if the result of the error checking algorithm indicates that the input signal was sent to the integrated circuit in error.

8. The integrated circuit of claim 7, wherein a processor responsively issues an address reset command.

9. The integrated circuit of claim 1, wherein the command is to forward the command to a next integrated circuit in the network.

10. The integrated circuit of claim 1, wherein the integrated circuit is in one of a hybrid vehicle and an electric vehicle.

11. The integrated circuit of claim 1, wherein the monitoring circuit is communicatively coupled to the controller and is configured to measure parameters of at least one of a battery, cells of a battery, and a battery stack, the parameters including at least one of temperature data, voltage data, and current data.

12. The integrated circuit of claim 11, wherein the measured parameters are from a lithium ion battery.

13. The integrated circuit of claim 1, wherein the command is to actuate a switch.

14. The integrated circuit of claim 1, wherein the input signal is received from the daisy chain network on a downstream side of the integrated circuit and the transceiver outputs measurement data to the downstream side of the integrated circuit.

15. A method of addressing an integrated circuit, comprising:

measuring an electrical signal presented at an input of the integrated circuit;

in a daisy chain network, receiving an input signal from the network representing a command identified in a command type field, the input signal directed to one of a plurality of integrated circuits in the daisy chain network identified by an address value provided in an address field of the command, and transmitting an output signal to the network; and with a controller communicatively coupled to the transceiver:

determining a type of the command;

based on the type of the command and the address value, executing the command; and issuing corresponding output signal content, wherein when the command comprises an instruction to report measurements, the integrated circuit outputs signal measurements to the daisy chain network.

16. The method of claim 15, wherein the input signal is received from one of a processor and another integrated circuit.

17. The method of claim 15, wherein executing the command comprises resetting the addresses of all the integrated circuits in the network.

18. The method of claim 17, wherein the resetting occurs during initialization.

19. The method of claim 17, wherein the resetting further comprises:

assigning a particular current address to the integrated circuit;

modifying the current address to a next address in a sequence;

forwarding the received address reset command, including the next address as a designated address, to the next integrated circuit.

20. The method of claim 19, wherein the current address is one of a predetermined address and a specified address.

21. The method of claim 15, further comprising the controller:

executing an error checking algorithm on the input signal to confirm that the command in the input signal is correctly addressed to the integrated circuit by using the provided address in the address field of the command to confirm the provided address is not corrupted; and sending a response to a processor if the result of the error checking algorithm indicates that the input signal was sent to the integrated circuit in error.

22. The method of claim 21, further comprising responsively issuing an address reset command with a processor.

23. The method of claim 15, wherein executing the command comprises forwarding the command to a next integrated circuit in the network.

24. The method of claim 15, wherein the integrated circuit is in one of a hybrid vehicle and an electric vehicle.

25. The method of claim 15, further comprising with a measurement circuit communicatively coupled to the controller:

measuring parameters of at least one of a battery, cells of a battery, and a battery stack, the parameters including at least one of temperature data, voltage data, and current data; and outputting signals representative of the measured parameter values.

26. The method of claim 25, wherein the measured parameters are from a lithium ion battery.

27. The method of claim 15, wherein executing the command comprises actuating a switch.

28. The method of claim 15, wherein the input signal is received from the daisy chain network on a downstream side of the integrated circuit and the measurement data is issued to the downstream side of the integrated circuit.

29. An integrated circuit for monitoring battery voltages in a wired network, comprising:
- a monitoring circuit to measure at least one voltage present on an input of the integrated circuit;
- a transceiver for receiving an input signal from the wired network representing a command, and for transmitting an output signal to the wired network; and
- a controller communicatively coupled to the transceiver and configured to:
  - determine a type of the command; and
  - when the command is an address reset command, to:
    - assign the address of the integrated circuit based on an address value received in the command;
    - modify the current address to a next address in a sequence; and
    - forward the received address reset command, including the next address as a designated address, to the next integrated circuit.

30. The integrated circuit of claim 29, wherein the controller further, when the command is an address reset command,
- assigns a new address to the integrated circuit based on an address value received in the command;
- modifies the current address to a next address in a sequence; and
- forwards the received address reset command, including the next address as a designated address, to the other integrated circuit.

* * * * *